(12) United States Patent
Tsai

(10) Patent No.: US 7,901,263 B2
(45) Date of Patent: Mar. 8, 2011

(54) MANUFACTURING METHOD FOR AN LED LIGHT STRING AND A JIG FOR MAKING THE LED LIGHT STRING

(75) Inventor: Kenneth Tsai, Dong Guan (CN)

(73) Assignee: Digicrown International Ltd., Dong Guan (CN)

( * ) Notice: Subject to any disclaimer, the term of this patent is extended or adjusted under 35 U.S.C. 154(b) by 485 days.

(21) Appl. No.: 12/007,574

(22) Filed: Jan. 11, 2008

(65) Prior Publication Data

US 2008/0200089 A1    Aug. 21, 2008

(30) Foreign Application Priority Data

Jan. 25, 2007   (TW) ............................... 96102761 A

(51) Int. Cl.
*H01J 9/24*     (2006.01)
*H01J 9/46*     (2006.01)
*H05B 33/10*    (2006.01)

(52) U.S. Cl. ............................................ 445/23; 445/66

(58) Field of Classification Search .................... 445/35, 445/66, 22; 362/227, 231, 249.01–249.09; 315/185

See application file for complete search history.

(56) References Cited

U.S. PATENT DOCUMENTS 5,406,693 A * 4/1995 Egashira et al. ................ 29/600
2005/0106710 A1* 5/2005 Friedman et al. .......... 435/287.1

* cited by examiner

*Primary Examiner* — Toan Ton
*Assistant Examiner* — Zachary Snyder
(74) *Attorney, Agent, or Firm* — Muncy, Geissler, Olds & Lowe, PLLC

(57) ABSTRACT

A method of manufacturing an LED light string using a jig having a main body and a plurality of spiral grooves formed thereon adjacent to each other is provided. The method includes winding an electrical wire in each of the grooves, removing portions of the electrical wires to provide a plurality of spaced exposed segments at successive locations on each of the electrical wires, placing LED chips on at least some of the plurality of exposed segments formed in one of the electrical wires, connecting each LED chip to a corresponding exposed segment on a different electrical wire by a connector, and sealing each LED chip and connector. A jig for attaching one or more LED chips to a plurality of electrical wires is also provided.

13 Claims, 6 Drawing Sheets

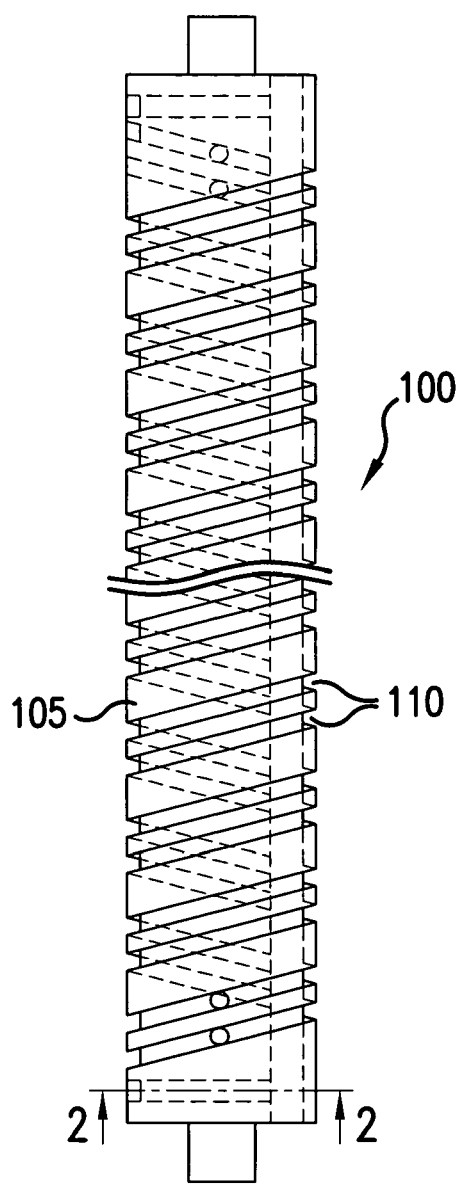
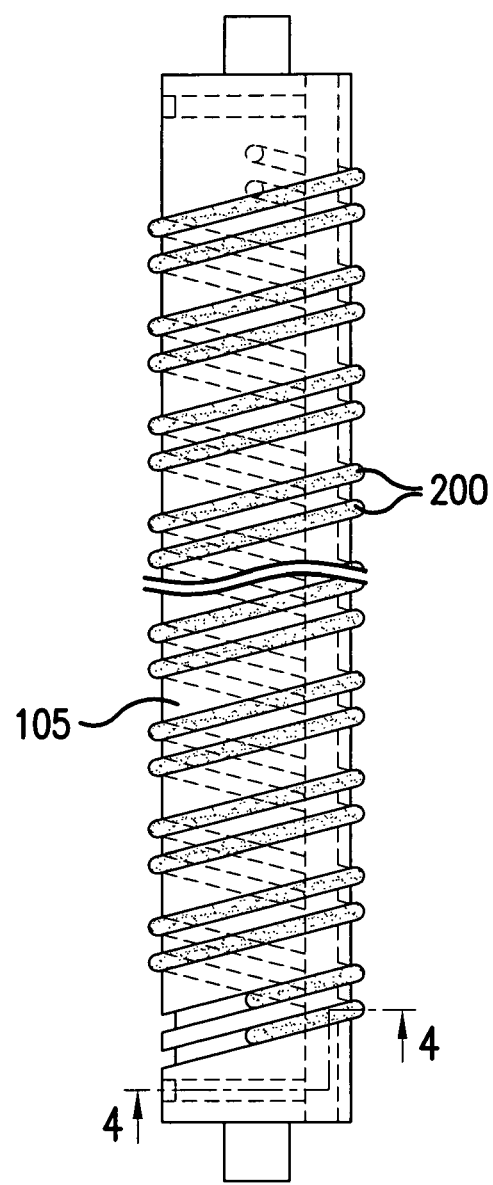
FIG.1  FIG.3
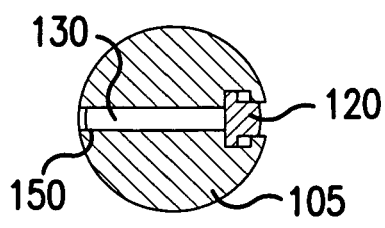
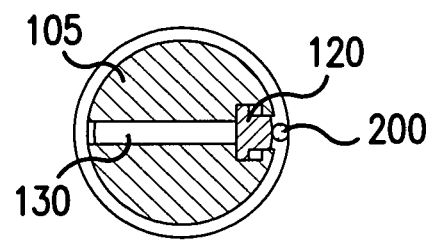
FIG.2  FIG.4

MANUFACTURING METHOD FOR AN LED LIGHT STRING AND A JIG FOR MAKING THE LED LIGHT STRING

CROSS REFERENCE TO RELATED APPLICATIONS

This application claims priority to Taiwanese Patent Application No. 96102761, filed Jan. 25, 2007, and is herein incorporated by reference in its entirety.

BACKGROUND OF THE INVENTION

1. Field of the Invention

The present invention generally relates to a method of manufacturing a light-emitting diode (LED) light string and jig for making the LED light string. More particularly, the present invention relates to a method of manufacturing the LED light string using a jig having a main body and a plurality of grooves formed thereon and the jig having the main body and the plurality of grooves formed thereon.

2. Description of Related Art

A traditional LED light string usually includes at least two electrical wires connected with a plurality of LEDs, each LED always has a pair of conductive legs for connecting the LED to the corresponding wires. Since the traditional LED must be directionally connected, it causes difficulty in assembling and is more susceptible to mistakes. Hence, an improved light string has been designed in Taiwanese Utility Model number 581188, which applies lighting chips to connect directly with the electrical wires that form lighting units on the light string.

Although the above LED light string provides an effective structure, there is still some difficulty in manufacturing. The procedures require placing electrical wires in a straight line and to remove parts of isolated surfaces at intervals for planting the chips. Because of this arrangement, the assembly requires a large workspace. In addition, it is difficult to place each interval accurately and as a result the manufacturing speed is slower than desired.

For these reasons, it is desirable to provide a new process that may be performed more quickly and accurately, and also minimizes workspace.

BRIEF SUMMARY OF THE INVENTION

The present invention is to provide a manufacturing method for an LED light string, which includes a smart position apparatus to complete a final product effectively in a limited space.

It is a primary objective of the present invention to provide serial automatic procedures to produce an LED light string with highest quality and efficiency. Now, accompanying with the following drawings, the character of the present invention will be described here and after.

According to principles of this invention, a method of manufacturing an LED light string using a jig having a main body and a plurality of spiral grooves formed thereon adjacent to each other is provided. The method includes winding an electrical wire in each of the grooves, removing portions of the electrical wires to provide a plurality of spaced exposed segments at successive locations on each of the electrical wires, placing LED chips on at least some of the plurality of exposed segments formed in one of the electrical wires, connecting each LED chip to a corresponding exposed segment on a different electrical wire by a connector, and sealing each LED chip and connector.

In another aspect, removing portions of the electrical wires may moving a cutting tool along a longitudinal axis of the main body. Alternatively, removing portions of the electrical wires may include moving the main body in the direction of a longitudinal axis of the main body past a cutting tool.

In a further aspect, each electrical wire may include a conductive core and an insulating member, wherein removing portions of the electrical wires may include removing portions of the insulating member.

In yet another aspect, the plurality of spiral grooves may include a first spiral groove, a second spiral groove, and a third spiral groove, each spiral groove being substantially uniformly spaced apart around the circumference of the main body. According to the method, winding the electrical wire in each of the grooves may include winding a first electrical wire in the first spiral groove, winding a second electrical wire the second spiral groove, and winding a third electrical wire in the third spiral groove; placing LED chips on some of the plurality of exposed segments may include placing an LED chip configured to transmit a first color and an LED chip configured to transmit a second color in an alternating pattern on the first electrical wire; and connecting each LED chip includes connecting each LED chip configured to transmit the first color to the second electrical wire, and connecting each LED chip configured to the transmit the second color to the third electrical wire.

In a different aspect, the LED chips may be one of (N-1) different colors, where N equals the number of electrical wires. Accordingly, each of the LED chips having the same color may be connected to one of the electrical wires not having the LED chips located thereon.

In still another aspect, the main body may include a displaceable member located therein, and the method may further include moving the displaceable member in a radial direction away from the main body to tighten the electrical wires prior to removing portions of the electrical wires.

In yet another aspect, each LED chip and connector are packaged individually.

In another aspect, the method may include cutting the electrical wires into segments, where each segment has a single LED chip.

In still another aspect, the method may include uniformly spacing the exposed segments of the electrical wires along a length of the electrical wires.

In still a further aspect, method may include controlling the spacing of the exposed segments by exchanging jigs having main bodies having at least one of different circumferences and different pitches for the spiral grooves.

According to principles of this invention, a jig for attaching one or more LED chips to a plurality of electrical wires is provided. The jig includes a main body having a plurality of spiral grooves formed in an exterior surface thereorof and a displaceable member radially moveable relative to a longitudinal axis of the body to tighten electrical wires wrapped around the main body in the grooves.

In another aspect, the jig may include a plurality of screws, where each screw cooperates with the displaceable member to radially move the displaceable member with respect to the main body. The main body may include a longitudinal groove and the displaceable member may be radially moveable within the longitudinal groove.

In a yet another aspect, the main body includes more than one displaceable member.

In still another aspect, the plurality of spiral grooves may include at least three spiral grooves.

In another aspect, the main body may have one of a round cross-section and an elliptical cross-section.

According to principles of this invention, an assembly for manufacturing an LED light string is provided. The assembly includes a jig having a main body and means for receiving a plurality of electrical wires. The means may include a plurality of spiral grooves around the main body.

In a further aspect, the assembly may include a cutting tool to remove portions of insulation from electrical wires received in the plurality of spiral grooves, thereby exposing conductive cores in each of the electrical wires.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 1 is a plan view showing a jig according to the present invention;

FIG. 2 is a cross-sectional view along line A-A of FIG. 1;

FIG. 3 is a plan view of FIG. 1 after winding electrical wires on the jig according to the present invention;

FIG. 4 is a cross-sectional view along line B-B of FIG. 3;

DETAILED DESCRIPTION OF THE INVENTION

Figure 10:
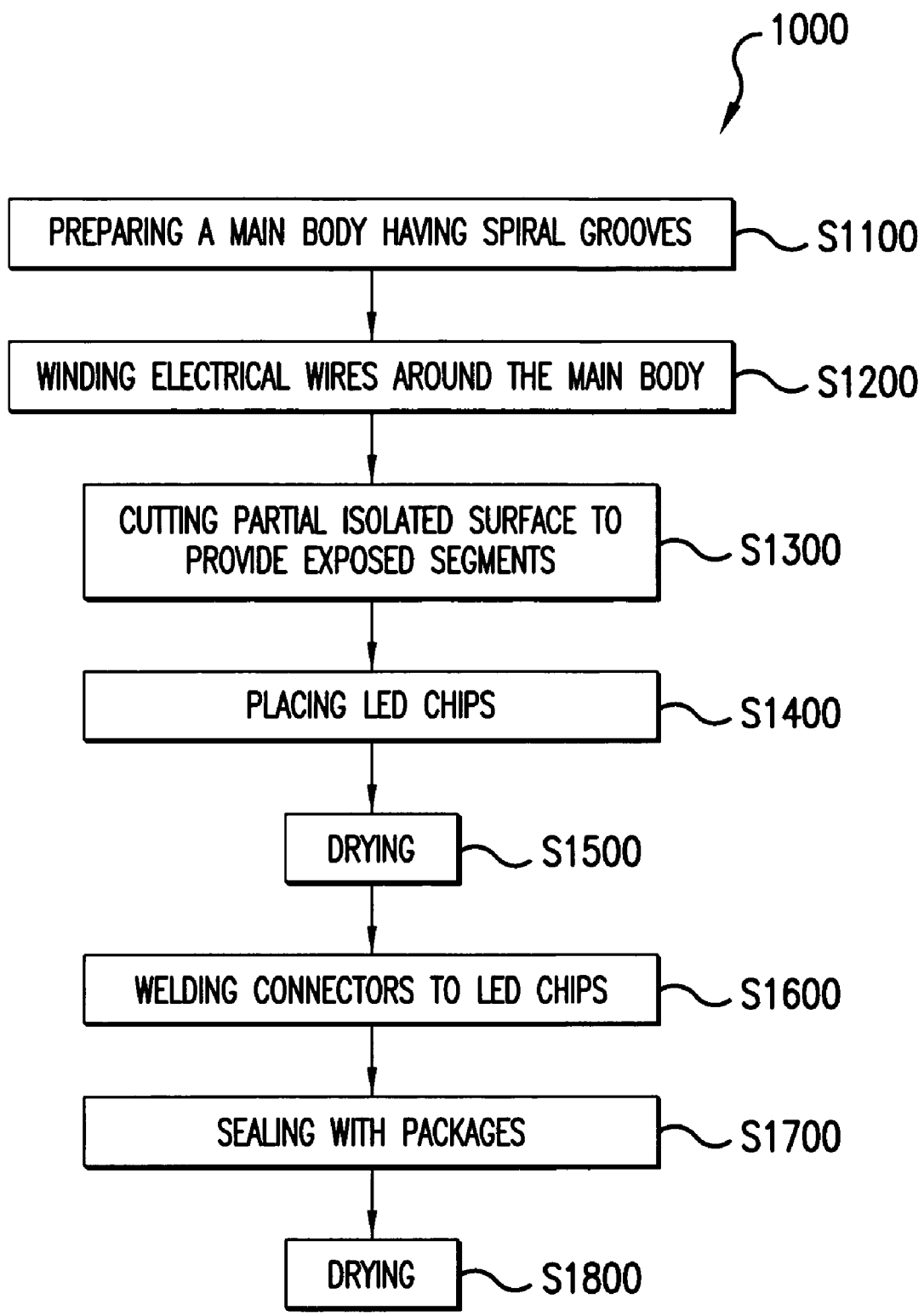
FIG. 10 shows a manufacturing flow chart according to the present invention.

A first exemplary manufacturing method and associated jig will be described with respect to FIGS. 1-8 and 10. Specifically, as shown in FIG. 10, the method of manufacturing an LED light string includes providing a jig having a main body and spiral grooves thereon (S1100); winding electrical wires around the body (S1200); cutting away portions of the electrical wires to expose segments of the conductive cores (S1300); placing an LED chip on each of the exposed segments associated with one of the electrical wires (S1400); drying the LED chip/electrical wire combination (S1500); welding connectors to electrically connect the LED chips with corresponding exposed segments of the other electrical wire (S1600); covering the LED chips and connectors with a package to seal the LED chips and the metal wires respectively to form a plurality of lighting units on an LED light string (S1700); and drying the packages (S1800).

In order to explain the manufacturing procedures of the present invention in detail, each of the steps will be discussed with reference to corresponding FIGS. 1-8. As shown in FIGS. 1 and 2, the present invention includes providing a jig 100 having a round main body 105, which has two spiral grooves 110 formed thereon (S1100). Preferably, the grooves 110 have the same pitch. As seen the main body has a round cross-section but other cross-sections can be provided, such as elliptical cross-sections.

A displaceable member 120 is located in the main body 105 and screws 130 are provided under both ends of the displaceable member 120. The displaceable member 120 is moveable radially with respect to the main body 105 within a longitudinal groove 140 that is configured to constrain the displaceable member 120 from being moved completely from the main body 105. The longitudinal groove 140 extends in a longitudinal direction of the main body 105. The screws extend through bores 150 that penetrate the main body 105 and the longitudinal groove 140. While the displaceable member 120 has been shown as a single body, two or more displaceable members could be used in place of the single displaceable member 120. By providing two or more displaceable members, along with corresponding pairs of screws, better support could be provided over the lengths of the displaceable members. In addition, each of the displaceable members could be displaced independently of each other.

As seen in FIGS. 3 and 4, two electrical wires 200 may be wound on the spiral grooves 110 of the main body 105 (S1200). After securing the ends of the electrical wires (not shown), the screws 130 can be adjusted to push the displaceable member 120 radially outward from the main body 105, thereby forcing the electrical wires to become more tightly secured around the main body 105. By controlling the depths of the screws, the tightness of the wires 200 may be adjusted.

Figure 5:
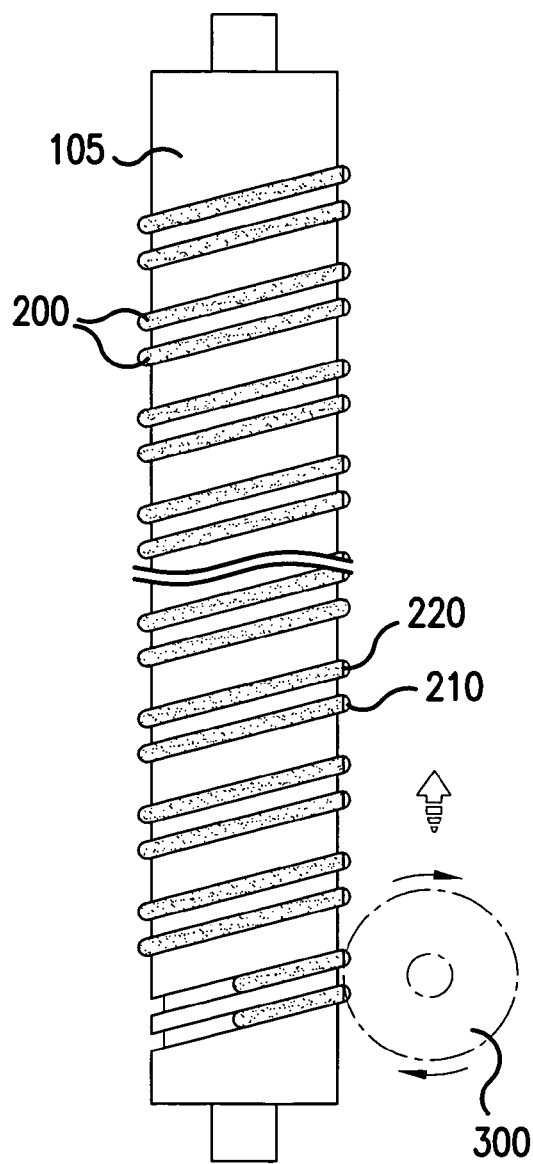
FIG. 5 is a plan view of FIG. 3 after a cutting process.

As seen in FIG. 5, once the electrical wires 200 are wound around the main body 105, a cutting tool 300 may be moved parallel to the axis of the main body 105 to remove parts of the electrical wires 200 to provide partial isolated surfaces 210 to expose corresponding exposed segments 220 (S1300). Alternatively, the cutting tool 300 may remain fixed while the main body 105 moves past the cutting tool 300. The partial isolated surfaces 210 may be formed in insulation around the conductive core of each electrical wire 200.

Figure 6:
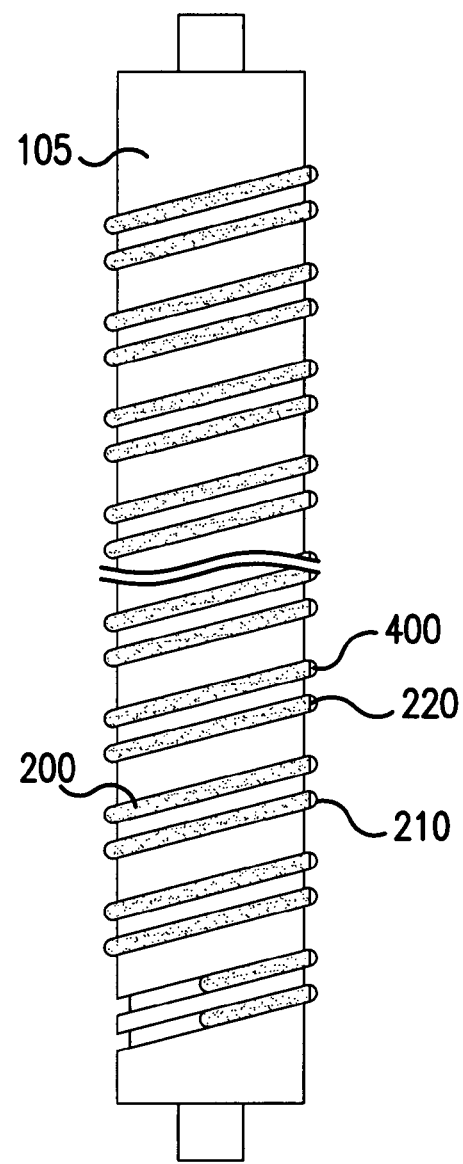
FIG. 6 is a plan view of FIG. 5 after planting chips.

Once the exposed segments 220 are formed on the electrical wires 200, an LED chip 400 is placed on and electrically connected to one of the exposed segments 220 associated with one of the electrical wires 200 (S1400), as seen in FIG. 6. The connection of the LED chip 400 to the electrical wire 200 is allowed to dry (S1500). An LED chip may be placed on one or more of the exposed segments 220 on one of the electrical wires 200.

Figure 7:
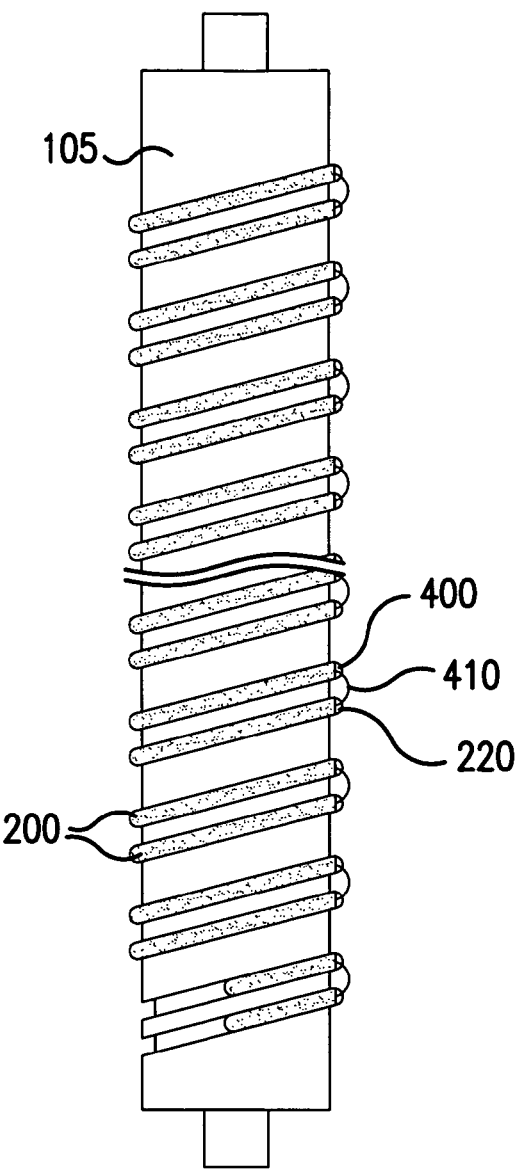
FIG. 7 is a plan view of FIG. 6 after connecting metal wires.

As seen in FIG. 7, connectors 410 are provided to electrically connect an LED chip 400 with a corresponding exposed segment 220 on the other electrical wire 200. These connectors may be thin metal wires that are thinner than the electrical wires 220 (S1600).

Figure 8:
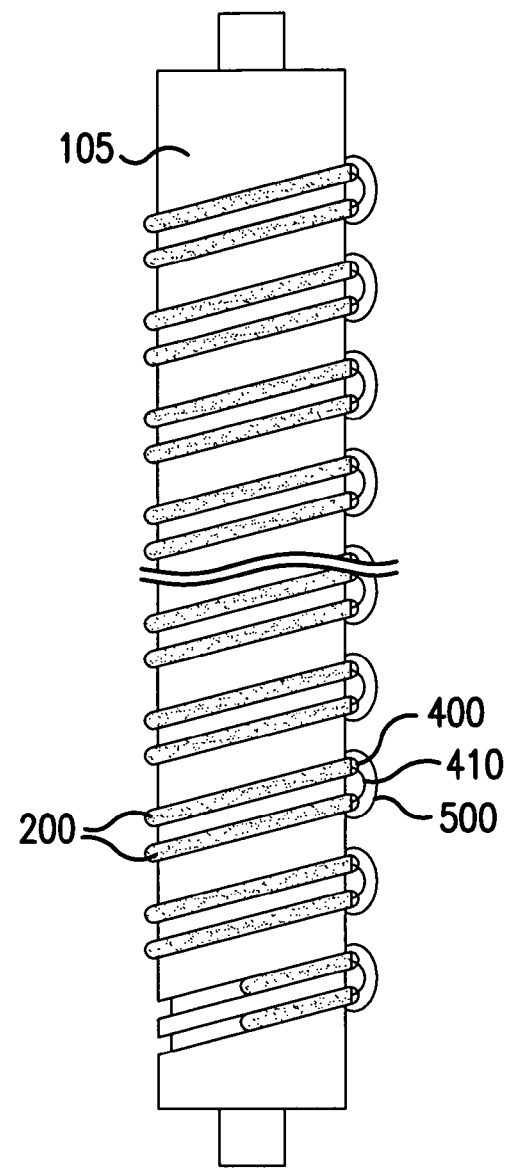
FIG. 8 is a plan view of FIG. 7 after sealing packages.

A package 500 is provided to seal each of the corresponding LED chip 400, connector 410, and electrical wires 200 (S1700), as seen in FIG. 8. The package 500 may be formed of some clear adhesive or other clear material. Finally the packages 500 are dried or otherwise cured to form a completed light string (S1800).

Figure 11A:
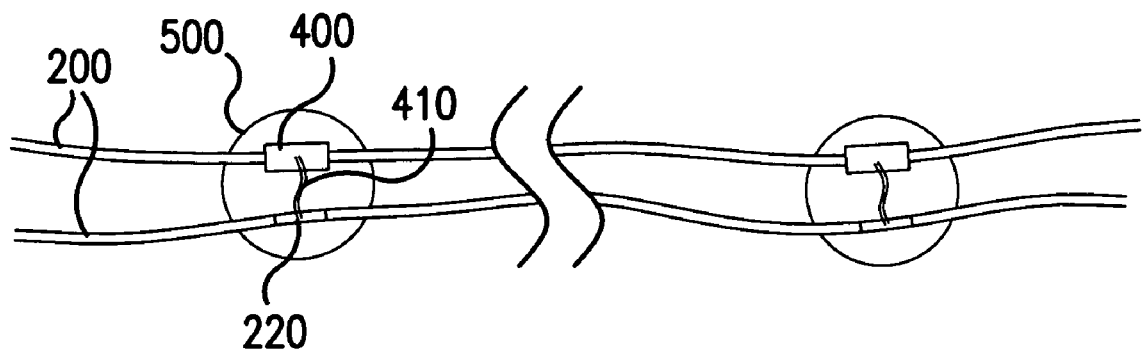
FIGS. 11A and 11B show various exemplary embodiments of LED(s) embedded onto electrical wires according to the present invention.
Figure 11B:
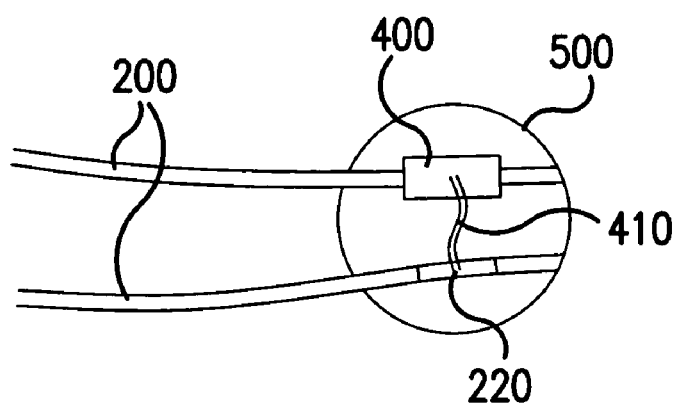

The light string may be removed from the jig 100 by adjusting the screws 130 and releasing the displaceable member 120 to allow the electrical wires to be removed. As seen in FIG. 11A, an LED light string having a plurality of LED chips 400 is formed. Alternatively, as seen in FIG. 11B, before or after the light string is removed from the main body 105, the electrical wires 200 may be cut adjacent the package 500 to provide segments having a single LED chip 400 and the corresponding portions of electrical wires 200.

Figure 9:
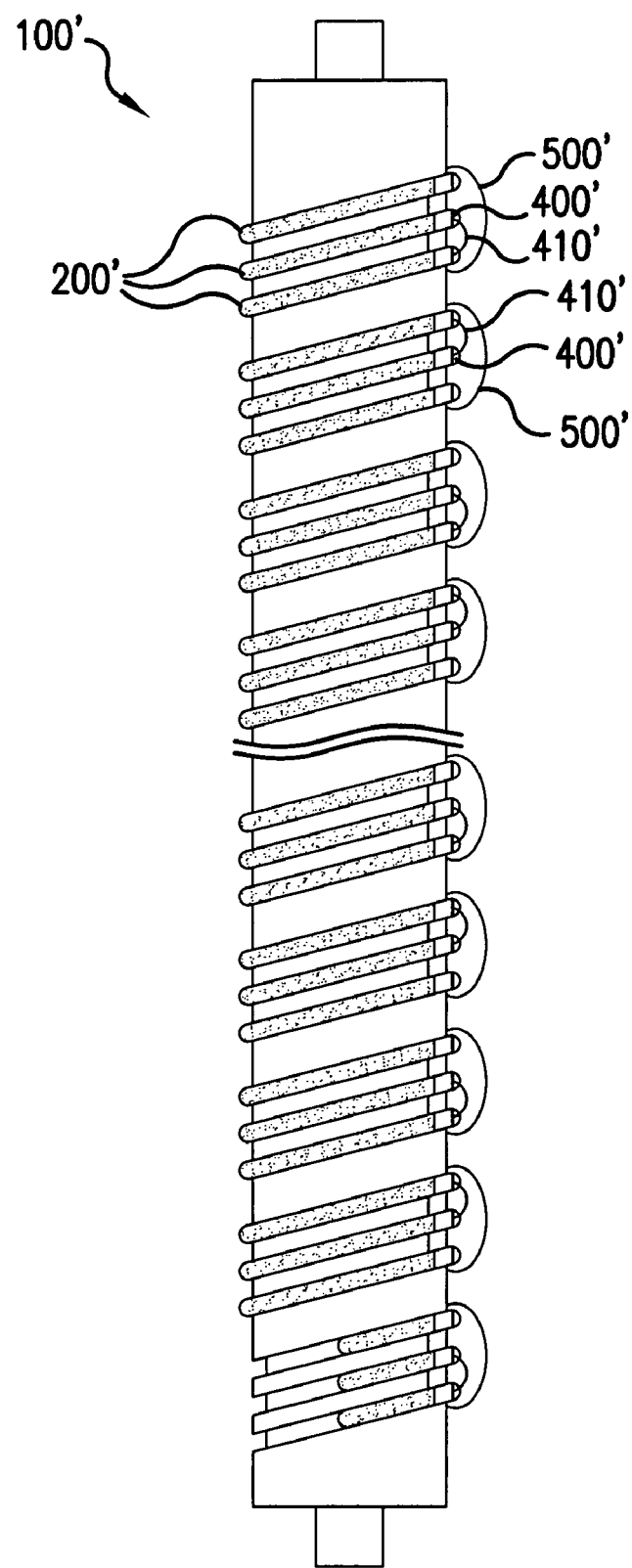
FIG. 9 is a plan view showing another embodiment with three electrical wires according to the present invention.

While the above method and jig 100 have been described for providing a light string with two electrical wires 200, with modification of the jig, a light string having three or more electrical wires may be provided. For example, as seen in FIG. 9, a jig 100' having three spiral grooves 110' formed in the main body 105' may be provided. This jig 100' allows for winding three electrical wires 200' to produce an LED light string having three electrical wires which provides greater flexibility in the configuration and operation of the LED light string.

For example, by providing three wires, an LED light string with two different color LED chips may be provided. In this configuration, an LED chip 400' is placed on each exposed segment 220' of the middle electrical wire 200'. A connector 410' is then electrically connected between the LED chip 400' and a corresponding exposed segment 220' on one of the outside electrical wires 200' in an alternating fashion such that half of the LED chips 400' are connected to one outside electrical wire 200' and the other half of the LED chips 400' are connected to the other outside electrical wire 200'. A package 500' is provided to seal each of the corresponding LED chip 400' and connector 410', It is understood that the association of each LED chip 400' with a particular outside electrical wire 200' determines the color pattern of the LED light string. Furthermore, it is understood that by providing additional electrical wires, additional color LED chips may be utilized, for example, four electrical wires will allow the use of three different color LED chips.

By providing more electrical wires 200, control of the light string is greatly enhanced. For example, the light string can be controlled to alternate between red, blue, green, and/or white light depending on the LED chip and which electrical wires 200 receive a current.

As described above, the present invention provides a method including cutting parts of isolated surfaces of the electrical wires quickly and accurately, connecting the LED chips 400 and metal wires 410, and sealing them with packages 500. Since the electrical wires are wound around the main body 105, a large working space is not necessary. Further, by cutting along the axis, several parts of isolated surfaces and exposed segments are formed at the same intervals resulting in each LED chip 400 being located at the correct position. It is understood that the interval may be adjusted by varying the size of the jig 100, either by using different size jigs or adjusting the amount of radial movement of the displaceable member 120 within the jig 100, or by using jigs having spirals with different pitches. It is also understood that the jig may have any suitable cross-sectional shape, such as, for example, circular or elliptical.

The invention thus being described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A method of manufacturing an LED light string using a jig having a main body and a plurality of spiral grooves formed thereon adjacent to each other, the method comprising:

winding an electrical wire in each of the grooves;
removing portions of the electrical wires to provide a plurality of spaced exposed segments at successive locations on each of the electrical wires;
placing LED chips on at least some of the plurality of exposed segments formed in one of the electrical wires;
connecting each LED chip to a corresponding exposed segment on a different electrical wire by a connector; and
sealing each LED chip and connector.

2. The method according to claim 1, wherein removing portions of the electrical wires includes moving a cutting tool along a longitudinal axis of the main body.

3. The method according to claim 1 wherein removing portions of the electrical wires includes moving the main body in the direction of a longitudinal axis of the main body past a cutting tool.

4. The method according to claim 1, wherein each electrical wire includes a conductive core and an insulating member, and wherein removing portions of the electrical wires includes removing portions of the insulating member.

5. The method according to claim 1, wherein the plurality of spiral grooves includes a first spiral groove, a second spiral groove, and a third spiral groove, each spiral groove being substantially uniformly spaced apart around the circumference of the main body;

winding the electrical wire in each of the grooves includes:
winding a first electrical wire in the first spiral groove,
winding a second electrical wire the second spiral groove, and
winding a third electrical wire in the third spiral groove;
placing LED chips on some of the plurality of exposed segments includes placing an LED chip configured to transmit a first color and an LED chip configured to transmit a second color in an alternating pattern on the first electrical wire; and
connecting each LED chip includes:
connecting each LED chip configured to transmit the first color to the second electrical wire, and
connecting each LED chip configured to the transmit the second color to the third electrical wire.

6. The method according to claim 1, wherein the LED chips may be one of (N−1) different colors, where N equals the number of electrical wires.

7. The method according to claim 1, wherein each of the LED chips having the same color are connected to one of the electrical wires not having the LED chips located thereon.

8. The method according to claim 1, wherein the main body includes a displaceable member located therein, the method includes moving the displaceable member in a radial direction away from the main body to tighten the electrical wires prior to removing portions of the electrical wires.

9. The method according to claim 1, wherein each LED chip and connector are packaged individually.

10. The method according to claim 1, further comprising cutting the electrical wires into segments, each segment having a single LED chip.

11. The method according to claim 1, further comprising uniformly spacing the exposed segments of the electrical wires along a length of the electrical wires.

12. The method according to claim 11, further comprising controlling the spacing of the exposed segments by exchanging jigs having main bodies having at least one of different circumferences and different pitches for the spiral grooves.

13. The method according to claim 1, further comprising the step of separating the sealed LED and a section of each electrical wire to form a single LED.

* * * * *